United States Patent
el-Hamdi et al.

(10) Patent No.: US 6,689,668 B1
(45) Date of Patent: Feb. 10, 2004

(54) METHODS TO IMPROVE DENSITY AND UNIFORMITY OF HEMISPHERICAL GRAIN SILICON LAYERS

(75) Inventors: Mohamed el-Hamdi, Austin, TX (US); Tony T. Phan, Flower Mound, TX (US); Luther Hendrix, Austin, TX (US); Bradley T. Moore, Austin, TX (US)

(73) Assignees: Samsung Austin Semiconductor, L.P., Austin, TX (US); Samsung Electronics Co., Ltd., Seoul (KR)

( * ) Notice: Subject to any disclaimer, the term of this patent is extended or adjusted under 35 U.S.C. 154(b) by 93 days.

(21) Appl. No.: 09/652,650

(22) Filed: Aug. 31, 2000

(51) Int. Cl.[7] .............................................. H01L 21/20
(52) U.S. Cl. .................... 438/398; 438/255; 438/96; 438/97; 438/365; 438/482; 438/485; 438/488; 438/510; 438/513; 257/52; 257/309
(58) Field of Search ................................ 438/398, 255, 438/96–97, 365, 368, 482–488, 510, 513; 257/52, 309

(56) References Cited

U.S. PATENT DOCUMENTS

| | | | |
|---|---|---|---|
| 4,203,158 A | 5/1980 | Frohman-Bentchkowsky et al. | ............................ 365/188 |
| 4,274,012 A | 6/1981 | Simko | ...................... 307/238.3 |
| 4,300,212 A | 11/1981 | Simko | ........................ 365/185 |

(List continued on next page.)

FOREIGN PATENT DOCUMENTS

| | | | | |
|---|---|---|---|---|
| EP | 0 120 830 | * | 2/1984 | .................... 21/322 |
| EP | 0295709 A2 | | 12/1988 | ............ H01L/27/10 |
| JP | 53-123687 | | 10/1978 | ............ H01L/27/10 |
| JP | 57-112066 | | 7/1982 | ............ H01L/27/10 |
| JP | 58-134458 | | 8/1983 | ............ H01L/27/04 |
| JP | 59-56754 | | 4/1984 | ............ H01L/27/04 |
| JP | 62-48062 | | 3/1987 | ............ H01L/27/10 |
| JP | 64-42161 | | 2/1989 | ............ H01L/27/04 |
| JP | 2000-036575 | | 2/2000 | ......... H01L/27/108 |

OTHER PUBLICATIONS

Watanabe et al. "hemispherical grained Si formation on in–situ phosphorus doped amorphous–si electrode for 256mb dram capacitor" IEEE transactions on electron devices vol. 42 No. 7 7/95 p. 1247–1254.*

Watanabe et al. "An advanced technique for fabricating hemispherical–grained (HSG) silicon storage electrodes" IEEE transactions on electron devices vol. 42 No. 2 Feb. 1995 p. 295–300.*

(List continued on next page.)

Primary Examiner—Matthew Smith
Assistant Examiner—Granvill D Lee, Jr.
(74) Attorney, Agent, or Firm—Timothy M. Honeycutt

(57) ABSTRACT

Various methods are provided of forming capacitor electrodes for integrated circuit memory cells in which out-diffusion of dopant from doped silicon layers is controlled by deposition of barrier layers, such as layers of undoped silicon and/or oxide. In one aspect, a method of forming hemispherical grain silicon on a substrate is provided that includes forming a first doped silicon layer on the substrate and a first barrier layer on the doped silicon layer. A hemispherical grain polysilicon source layer is formed on the first barrier layer and a hemispherical grain silicon layer on the hemispherical grain polysilicon source layer. By controlling out-diffusion of dopant, HSG grain size, density and uniformity, as well as DRAM memory cell capacitance, may be enhanced, while at the same time maintaining reactor throughput.

40 Claims, 10 Drawing Sheets

U.S. PATENT DOCUMENTS

| | | | |
|---|---|---|---|
| 4,314,265 A | 2/1982 | Simko | 357/23 |
| 4,486,769 A | 12/1984 | Simko | 357/41 |
| 4,520,461 A | 5/1985 | Simko | 365/184 |
| 4,617,652 A | 10/1986 | Simko | 365/203 |
| 4,742,018 A | 5/1988 | Kimura et al. | 437/48 |
| 4,758,986 A | 7/1988 | Kho | 368/185 |
| 4,763,299 A | 8/1988 | Hazani | 365/51 |
| 4,845,538 A | 7/1989 | Hazani | 357/23.5 |
| 4,958,318 A | 9/1990 | Harari | 365/169 |
| 4,974,040 A | 11/1990 | Taguchi et al. | 357/23.6 |
| 5,040,036 A | 8/1991 | Hazani | 357/23.5 |
| 5,043,780 A | 8/1991 | Fazan et al. | 357/23.6 |
| 5,047,814 A | 9/1991 | Hazani | 357/23.5 |
| 5,087,583 A | 2/1992 | Hazani | 437/43 |
| 5,099,297 A | 3/1992 | Hazani | 357/23.5 |
| 5,134,086 A | 7/1992 | Ahn | 437/52 |
| 5,153,685 A | 10/1992 | Murata et al. | 357/23.6 |
| 5,162,247 A | 11/1992 | Hazani | 437/43 |
| 5,162,248 A | 11/1992 | Dennison et al. | 437/52 |
| 5,166,904 A | 11/1992 | Hazani | 365/218 |
| 5,227,322 A | 7/1993 | Ko et al. | 437/47 |
| 5,247,346 A | 9/1993 | Hazani | 257/314 |
| 5,278,785 A | 1/1994 | Hazani | 365/182 |
| 5,296,385 A * | 3/1994 | Moslehi et al. | 437/20 |
| 5,302,540 A | 4/1994 | Ko et al. | 437/47 |
| 5,303,185 A | 4/1994 | Hazani | 365/185 |
| 5,304,505 A | 4/1994 | Hazani | 437/52 |
| 5,332,914 A | 7/1994 | Hazani | 257/320 |
| 5,340,765 A | 8/1994 | Dennison et al. | 437/52 |
| 5,350,707 A | 9/1994 | Ko et al. | 437/52 |
| 5,352,923 A | 10/1994 | Boyd et al. | 257/536 |
| 5,358,888 A | 10/1994 | Ahn et al. | 437/52 |
| 5,405,801 A | 4/1995 | Han et al. | 437/60 |
| 5,418,180 A | 5/1995 | Brown | 437/60 |
| 5,447,878 A | 9/1995 | Park et al. | 437/52 |
| 5,466,628 A | 11/1995 | Lee et al. | 437/60 |
| 5,476,805 A | 12/1995 | Woo et al. | 437/52 |
| 5,498,562 A | 3/1996 | Dennison et al. | 437/52 |
| 5,597,754 A | 1/1997 | Lou et al. | 437/52 |
| 5,597,756 A | 1/1997 | Fazan et al. | 437/52 |
| 5,641,707 A | 6/1997 | Moslehi | 438/513 |
| 5,714,401 A | 2/1998 | Kim et al. | 437/52 |
| 5,721,147 A | 2/1998 | Yoon | 437/31 |
| 5,759,894 A | 6/1998 | Tseng et al. | 438/255 |
| 5,770,500 A | 6/1998 | Batra et al. | 438/255 |
| 5,792,689 A | 8/1998 | Yang et al. | 438/253 |
| 5,798,280 A | 8/1998 | Mathews et al. | 437/165 |
| 5,798,545 A | 8/1998 | Iwasa et al. | 257/301 |
| 5,804,480 A | 9/1998 | Lu et al. | 438/253 |
| 5,804,481 A | 9/1998 | Tseng | 438/255 |
| 5,854,095 A | 12/1998 | Kang et al. | 438/255 |
| 5,874,330 A | 2/1999 | Ahn | 438/230 |
| 5,882,991 A | 3/1999 | Paranjpe | 438/565 |
| 5,885,869 A * | 3/1999 | Turner et al. | 438/261 |
| 5,943,584 A | 8/1999 | Shim et al. | 438/398 |
| 6,015,743 A * | 1/2000 | Chang et al. | 438/398 |
| 6,069,053 A * | 5/2000 | Ping et al. | 438/398 |
| 6,194,265 B1 * | 2/2001 | Chang et al. | 438/255 |
| 6,218,260 B1 | 4/2001 | Lee et al. | 438/398 |
| 6,255,159 B1 * | 7/2001 | Thakur | 438/253 |
| 6,291,850 B1 | 9/2001 | Choi et al. | 257/309 |
| 6,326,277 B1 * | 12/2001 | DeBoer | 438/398 |
| 6,403,455 B1 * | 6/2002 | el-Hamdi et al. | 438/565 |
| 6,509,227 B1 * | 1/2003 | Ping et al. | 438/255 |
| 6,511,892 B1 * | 1/2003 | Ping et al. | 438/398 |
| 2001/0044182 A1 * | 11/2001 | Sakoh et al. | 438/255 |
| 2002/0004273 A1 * | 1/2002 | Manabe | 438/254 |

OTHER PUBLICATIONS

Stanley Wolf and Richard N. Tauber; *Silicon Processing for the VLSI Era*, vol. 1—*Process Technology*; p. 182; 1986.

T. Mine et al.; *Capacitance–Enhanced Stacked–Capacitor with Engraved Storage Electrode for Deep Submicron DRAMs*; pp. 137–140; Aug. 1989.

H. A. Richard Wagener; *Endurance Model for Textured–Poly Floating Gate Memories*–IEDM; pp. 480–483; 1984.

H. Arima et al.; *A Novel Stacked Capacitor Cell With Dual Cell Plate for 64Mb DRAMs*–IDEM; 651–654; 1990.

M. Sakao et al.; *A Capacitor–Over–Bit–Line (COB) Cell With a Hemispherical–Grain Storage Node for 64Mb DRAMs*–IEEE; 655–658; 1990.

H. Watanabe et al.; A New Cylindrical Capacitor Using Hemispherical Grained Si (HSG–Si) for 256Mb DRAMs; 259–262; 1992.

* cited by examiner

Oxide covers S-poly surface

METHODS TO IMPROVE DENSITY AND UNIFORMITY OF HEMISPHERICAL GRAIN SILICON LAYERS

BACKGROUND OF THE INVENTION

1. Field of the Invention

This invention relates generally to semiconductor fabrication, and more particularly to methods of forming capacitor electrodes for integrated circuit memory cells.

2. Description of the Related Art

Device scaling in integrated circuit design has produced an attendant decrease in the available wafer areas for devices, such as dynamic random access memory cells ("DRAMs"). As a consequence, memory cell capacitors must be squeezed into ever shrinking spaces. Because the capacitance of a memory cell capacitor is proportional to the surface area of the capacitor electrodes, the job of maintaining or even increasing device capacitance while minimum geometries continue to shrink is difficult. Because DRAM memory cell operation typically improves with increased capacitance, a variety of methods have been developed in an attempt to if increase storage electrode surface areas while at the same time maintaining or reducing wafer area taken up by a memory cell. Examples of electrode designs having greater surface area include trench and stacked capacitor configurations as well as cylindrical and finned capacitor configurations.

One method for increasing electrode surface area involves the formation of an electrode with a roughened or irregular outer surface. Methods for providing a roughened electrode surface include those employing hemispherical grain ("HSG") silicon. In this method, a memory cell access transistor is formed on a semiconductor substrate. An insulating layer is then formed on the substrate and the access transistor. A doped amorphous silicon layer is then formed on the insulating layer, frequently by reacting a silicon source gas such as silane ($SiH_4$) or disilane ($Si_2H_6$) with a dopant gas such as phosphine ($PH_3$).

Next, a hemispherical grained surface is formed on the doped silicon layer. There are a number of different methods known in the art for forming an HSG silicon film, including by gas-phased nucleation and surface seeding. In the first method, a doped amorphous silicon layer is subjected to a vacuum anneal to redistribute silicon atoms in the amorphous silicon layer to form hemispherical grains of polysilicon. In the second alternative, an amorphous silicon layer is processed at a temperature of about 550° C. to about 600° C. and exposed to a silicon gas source so as to form silicon nuclei on the amorphous layer. This structure may then be annealed in the absence of the silicon gas source to grow silicon nuclei and form the HSG polysilicon film.

Polysilicon storage cells or electrodes are provided with n-type or p-type dopants as a means of increasing their capacitance and DRAM performance. Although the use of dopants such as phosphorus is desirable from a device operation standpoint, there are certain manufacturing drawbacks. For example, out-diffusion of dopant from a doped silicon layer may occur during subsequent high temperature steps and lead to thickness fluctuations in deposited capacitor dielectric films. Controlling fluctuation in capacitor dielectric thickness is desirable because the thickness of the dielectric dictates the amount of charge that may be stored without damaging the capacitor. The capacitor dielectric is advantageously formed with a thickness that is as small as possible, but that still avoids dielectric breakdown. Furthermore, the unwanted migration of phosphorus may also adversely affect HSG growth. The mechanism is thought to be the result of dopant atoms forming a resistant path to the autodiffusion of surface amorphous silicon atoms. The problem of out-diffusion may be more prevalent in circumstances where a doped silicon layer is formed on both the front side and the backside of the wafer.

One method of improving uniformity of silicon nitride capacitor dielectric deposition from batch to batch is to reduce the number of wafers in a reactor chamber batch. However, reduction of the number of wafers in each furnace load (such as from 6 lots to 4 lots) typically results in logistics and throughput difficulties during, for example, nitride deposition.

SUMMARY OF THE INVENTION

In accordance with one aspect of the present invention, a method of forming hemispherical grain silicon on a substrate is provided that includes forming a first doped silicon layer on the substrate and forming a first undoped amorphous silicon barrier layer on the doped silicon layer. A hemispherical grain silicon layer is formed on the undoped amorphous silicon barrier layer.

In accordance with another aspect of the present invention, a method of forming a memory cell storage electrode on substrate is provided that includes forming a first doped silicon layer on the substrate and forming a first undoped amorphous silicon barrier layer on the doped silicon layer. A hemispherical grain silicon layer is formed on the undoped amorphous silicon barrier layer and a capacitor dielectric layer is formed on the hemispherical grain silicon layer.

In accordance with another aspect of the present invention, a method of forming hemispherical grain silicon on a substrate having a front side and a backside is provided that includes forming a first doped silicon layer on the front side and a second doped silicon layer on the backside and forming a first barrier layer on the first doped silicon layer and a second barrier layer on the second doped silicon layer. A hemispherical grain silicon layer is formed on the first doped silicon layer.

In accordance with another aspect of the present invention, a method of forming a memory cell capacitor on a substrate is provided that includes forming a first doped silicon layer on the substrate and a first undoped amorphous silicon barrier layer on the first doped silicon layer. A hemispherical grain silicon layer is formed on the first undoped amorphous silicon barrier layer. A capacitor dielectric layer is formed on the hemispherical grain silicon layer and a top electrode is formed on the capacitor dielectric.

In accordance with another aspect of the present invention, a method of forming hemispherical grain silicon on a substrate is provided that includes forming a first doped silicon layer on the substrate and a-first oxide barrier layer on the doped silicon layer. The first oxide layer and the first doped silicon layer are patterned into a desired shape. The first oxide barrier layer is removed and a hemispherical grain silicon layer is formed on the first doped silicon layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
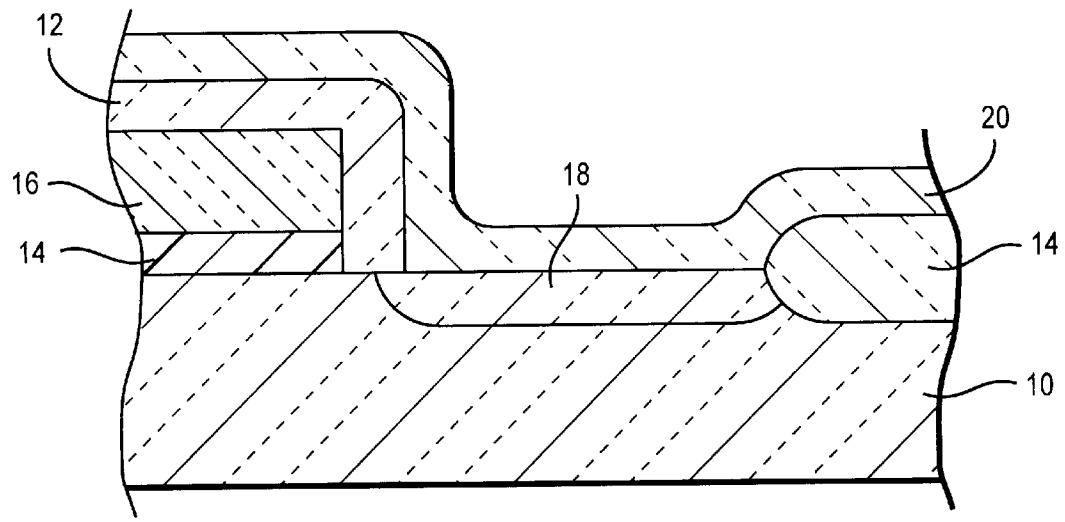
FIG. 1 is a simplified partial cross-sectional view of a semiconductor substrate showing a partially completed memory cell formed according to a conventional process.
Figure 2:
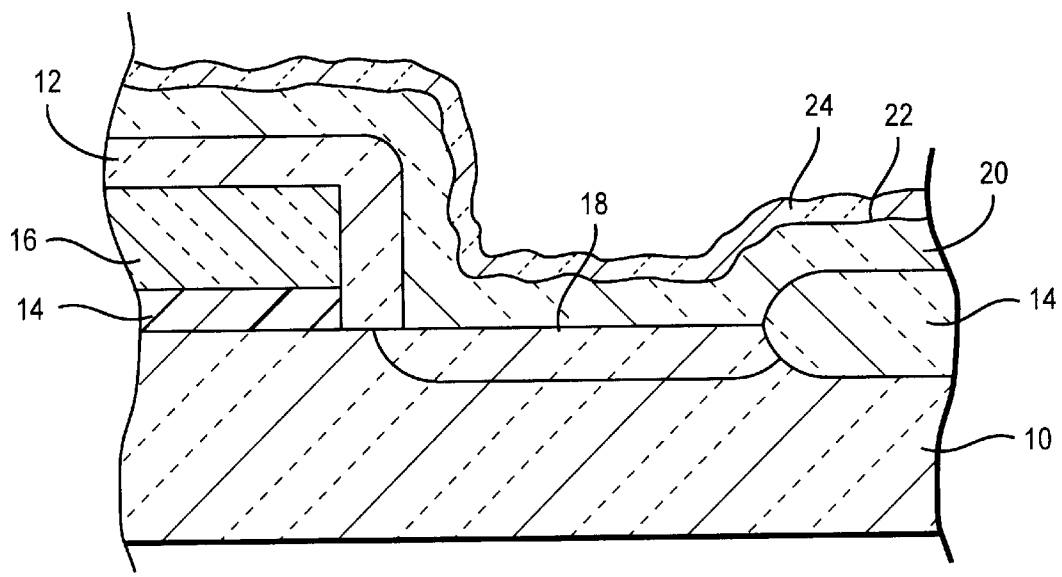
FIG. 2 is a simplified partial cross-sectional view of a semiconductor substrate showing a partially completed memory cell formed according to a conventional process.

In the drawings described below, reference numerals are generally repeated where identical elements appear in more than one figure. FIGS. 1 and 2 illustrate a conventional method for forming a simple hemispherical grade silicon capacitor electrode. Turning initially to FIG. 1, a memory cell access transistor is formed on a semiconductor substrate 10, for example, including source/drain areas 18, field oxide regions 14 and polysilicon wordline gate areas 16. An insulating layer 12 is then formed on the substrate 10 and the memory cell access transistor. A contact hole is formed through the insulating layer 12, for example, using photolithographic and etched steps to expose source-drain region 18. A doped silicon layer 20 (amorphous or polysilicon) is formed on the insulating layer 12, for example, by reacting a silicon source gas such as silane ($SiH_4$) or disilane ($Si_2H_6$) with a dopant gas such as $PH_3$.

Referring now to FIG. 2, an HSG silicon surface 22 is formed on the silicon layer 20 and a capacitor dielectric layer 24 is formed on the HSG silicon surface 22. A hemispherical grained surface 22 may be formed by a number of different methods known in the art, including gas-phased nucleation or surface seeding. In one method, the first doped silicon layer 20 may be amorphous silicon that is subjected to a vacuum anneal to redistribute silicon atoms in the amorphous silicon layer to form hemispherical grains of polysilicon. Alternatively, an amorphous silicon layer may be processed, for example, at a temperature of from about 550° C. to 600° C. and exposed to a silicon gas source so as to form silicon nuclei on the amorphous layer. This structure may then be annealed in the absence of the silicon gas source to grow silicon nuclei and form the hemispherical grained polysilicon surface 22.

When silicon nitride is deposited as a dielectric layer, or as part of a dielectric layer, low pressure chemical vapor deposition ("LPCVD") at temperatures of about 680° C. to 780° C. may be employed. Following deposition of the dielectric layer 24, a top electrode layer (not shown), may be formed as a second or top capacitor electrode.

As noted above, the silicon layer 20 is doped to improve device characteristics. However the dopant may exhibit out-diffusion and adversely affect the growth of the HSG silicon surface 22 and the deposition of the capacitor dielectric 24.

Figure 3:
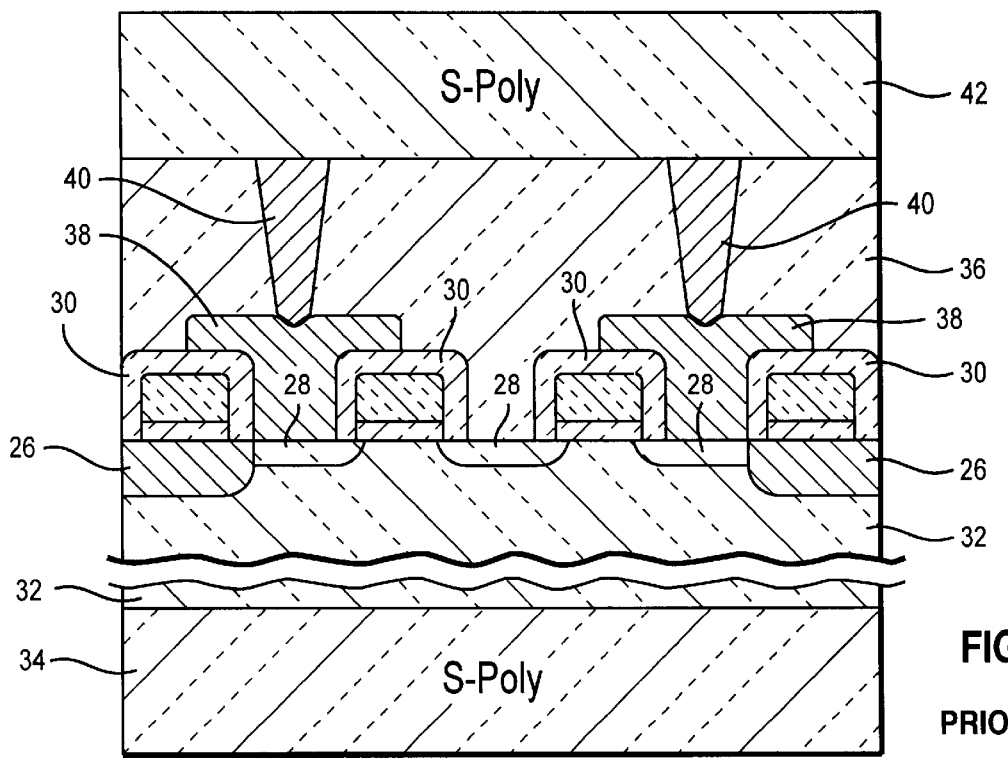
FIG. 3 is a simplified partial cross-sectional view of a semiconductor substrate showing a partially completed memory cell formed according to a conventional process.

The problem of dopant out-diffusion is not necessarily limited to the memory cell structure illustrated in FIG. 1 and 2. FIGS. 3–6 illustrate a conventional method for forming a memory cell incorporating stacked, doped polysilicon capacitor storage electrodes. Referring initially to FIG. 3, field oxide regions 26, source/drain regions 28, and wordline gate areas 30 are formed on a semiconductor substrate 32 using methods known in the art including, for example, those described elsewhere herein. The substrate 32 has a backside, doped polysilicon layer 34. An insulating layer 36 is shown formed on substrate 32, and may be, for example, silicon oxide or boro-phospho-silicate-glass ("BPSG"). Contact holes for conductive contact plugs 38 are shown formed in insulating layer 36, for example, by photolithographic and etch steps. Conductive contact plugs 40 are provided for accessing the later-formed storage electrodes, and may be formed, for example, from doped polysilicon or a conductive refractory metal, such as tungsten. A phosphorus doped polysilicon layer 42 is formed over the insulating layer 36 but in contact with the plugs 40.

Figure 4:
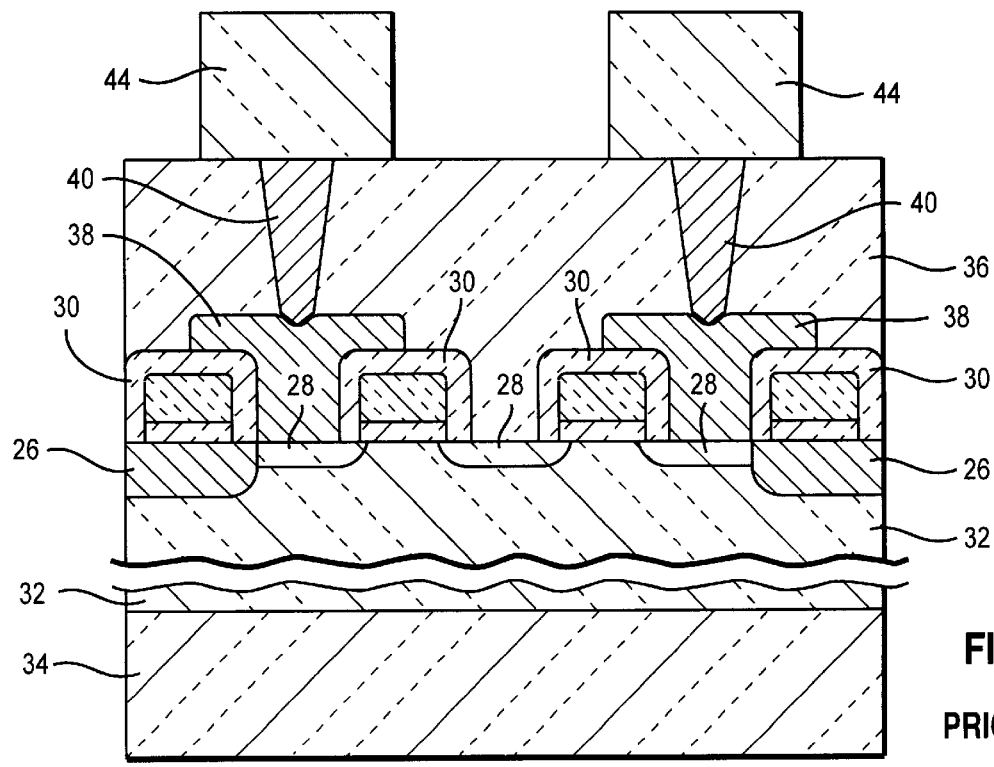
FIG. 4 is a simplified partial cross-sectional view of a semiconductor substrate showing a partially completed memory cell formed according to a conventional process.

Referring now to FIG. 4, the phosphorus-doped polysilicon layer 42 is masked with photoresist (not shown).

Thereafter, the phosphorus-doped polysilicon layer 42 is etched to yield storage electrodes 44.

Figure 5:
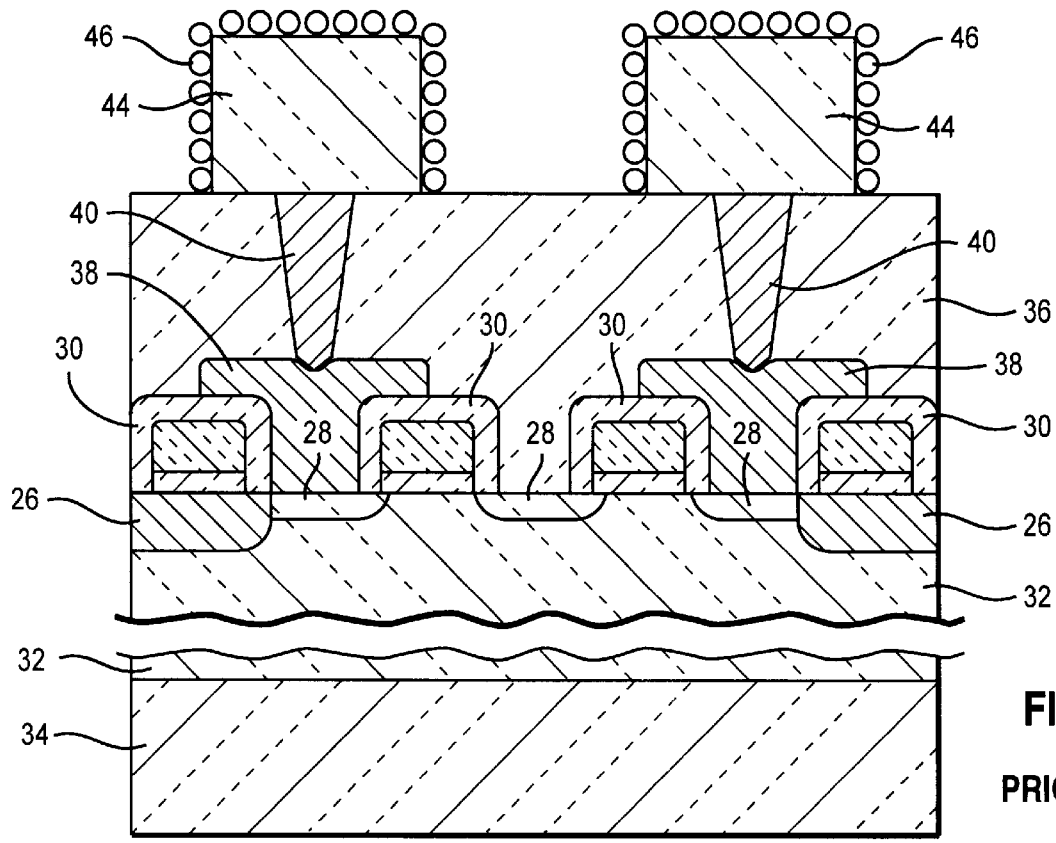
FIG. 5 is a simplified partial cross-sectional view of a semiconductor substrate showing a partially completed memory cell formed according to a conventional process.

Referring now to FIG. 5, a HSG silicon surface 46 is formed on the storage electrodes 44 using the methods described above. Thereafter, and as shown in FIG. 6, a capacitor dielectric film 48 is formed on storage electrodes 44 using the methods described above.

Figure 7:
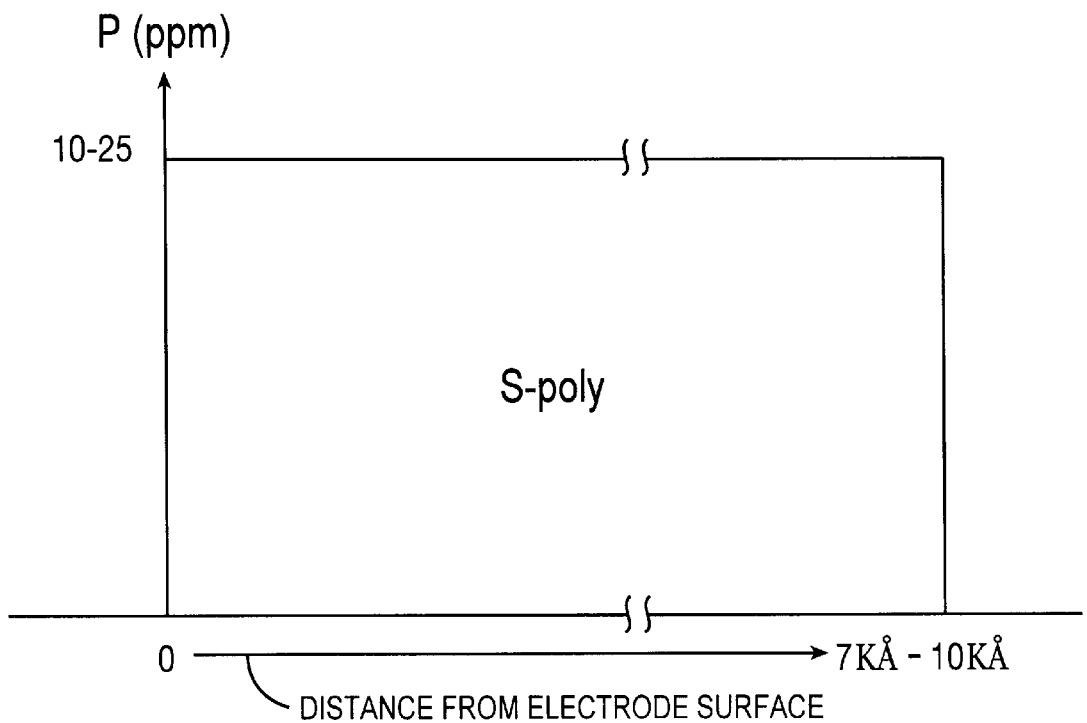
FIG. 7 shows phosphorus dopant concentration profile for a phosphorus doped polysilicon electrode formed according to a conventional process.

FIG. 7 represents phosphorus concentration as a function of distance from the surface of the doped silicon electrodes 44 of FIG. 4. The y-axis represents the outer surface of the doped polysilicon storage electrodes 44. During deposition of the doped silicon layer 42, a phosphine gas source is present with a silicon source gas, such as silane or disilane throughout the deposition. Consequently, phosphorus doping concentration is constant throughout the film 42, for example at about 15 ppm, as shown in FIG. 7. A similar profile should be expected to occur in the doped polysilicon layer 34 on the backside of the substrate 32. During subsequent high temperature processing, such as an HSG anneal and nitride loading for the capacitor dielectric layer 48, phosphorus out-diffuses from the doped silicon electrodes 44 and the doped polysilicon backside layer 34. In a deposition chamber, such as a LPCVD chamber (not shown), phosphorus concentration in the gas phase results from this out-diffusion, and is typically proportional to the number of wafers present in a batch. Because of the phosphorus out-diffusion, the capacitor dielectric deposition rate may be transient in the early stages of, for example, nitride loading, stabilizing later when phosphorus is displaced from the CVD chamber.

Figure 6:
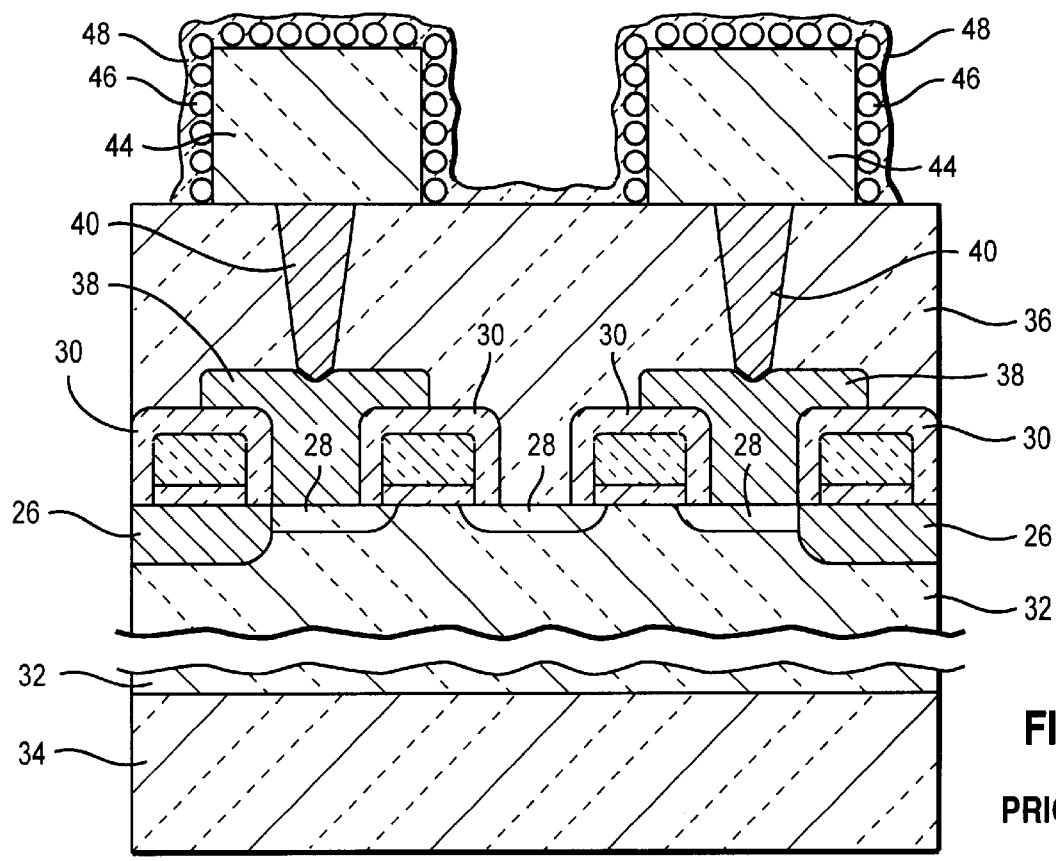
FIG. 6 is a simplified partial cross-sectional view of a semiconductor substrate showing a partially completed memory cell formed according to a conventional process.
Figure 8:
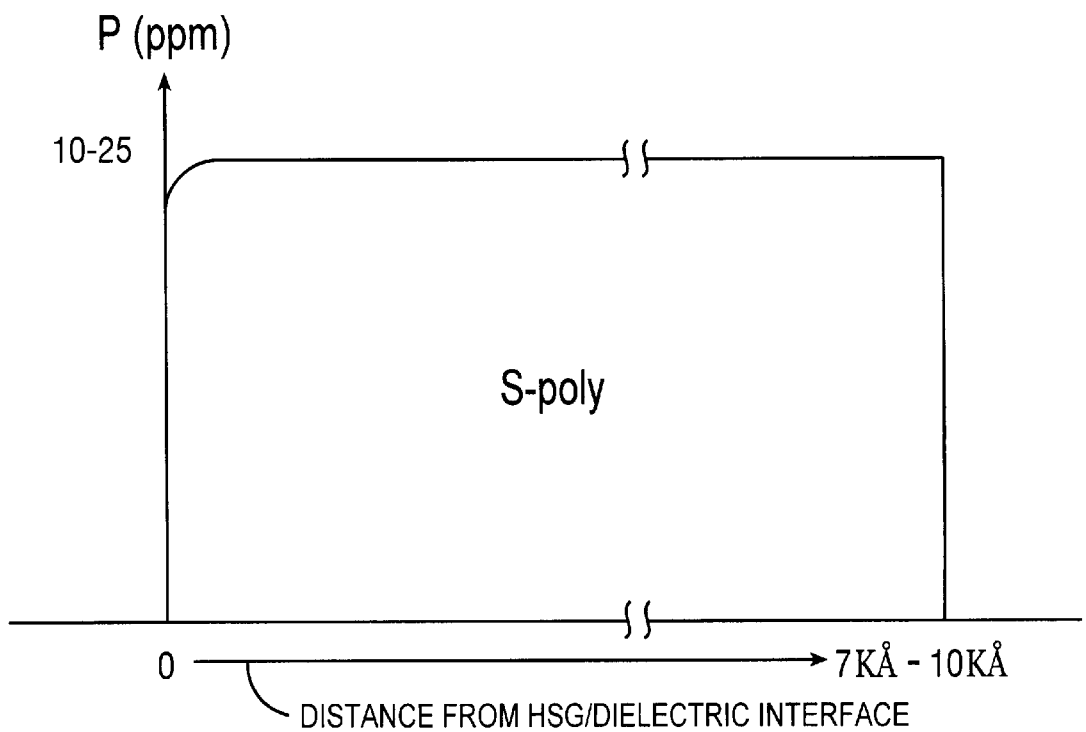
FIG. 8 shows phosphorus dopant concentration profile for a phosphorus doped polysilicon electrode formed according to a conventional process.

As may be seen in FIG. 8, after HSG and dielectric layer processing, phosphorus levels of about 13 to 22 ppm exist at the interface of the HSG layer 46 and the capacitor dielectric layer 48 of the stacked doped silicon electrodes 44 of FIG. 6. A similar profile should be expected to occur up to the surface of the doped polysilicon layer 34 on the backside of the substrate 32. The existence of phosphorus at the surface of the HSG layer 46 results from out-diffusion of phosphorus from doped silicon electrodes 44 and from doped silicon backside layer 34 during the HSG anneal and/or the dielectric layer 48 deposition. The presence of phosphorus atoms may adversely affect HSG formation, for example, by forming a resistant path to autodiffusion of surface amorphous silicon atoms. This interferes with density, uniformity and grain size of the HSG surface 46. Furthermore, phosphorus out-diffusion from doped silicon electrodes 44 at elevated temperatures (for example, during silicon nitride loading of a capacitor dielectric formation step) results in phosphorus concentration in the gas phase which interferes with nitride deposition rate in the early stages, stabilizing only when phosphorus is chased out of the reactor. This results in a dielectric layer 48 thickness which is typically inversely proportional to the number of wafers present in the furnace.

As noted above, one method of improving uniformity of silicon nitride deposition from batch to batch is to reduce the number of wafers in a reactor vessel batch. However, reduction of the number of wafers in each furnace load (such as from 6 lots to 4 lots) typically results in logistics and throughput difficulties during, for example, nitride deposition.

Figure 9:
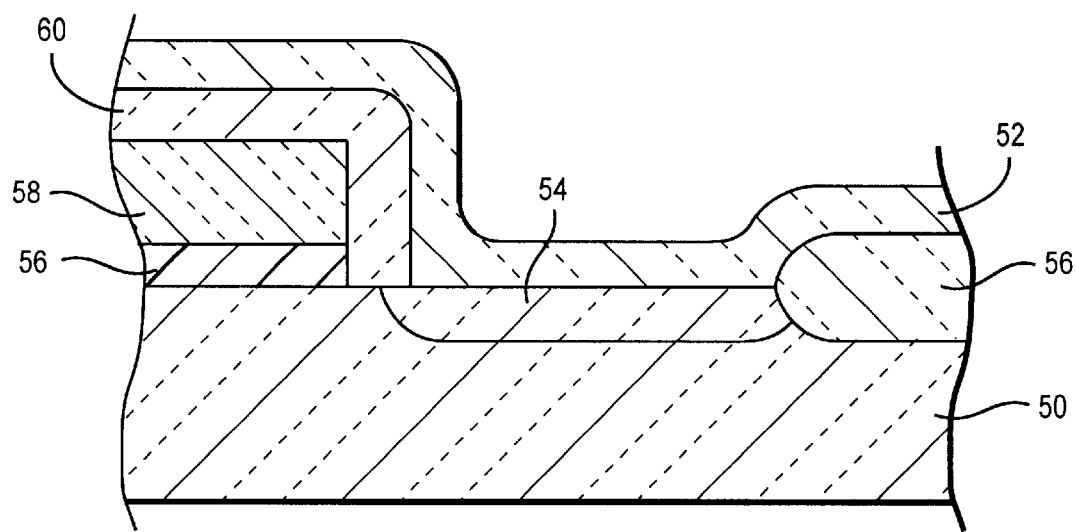
FIG. 9 is a simplified partial cross-sectional view of a semiconductor substrate. showing a partially completed memory cell formed in accordance with the present invention.

FIGS. 9–20 illustrate various exemplary methods in accordance with the present invention of fabricating memory cell capacitor devices. Turning initially to FIG. 9, therein is shown a substrate 50 and components of a memory cell access transistor having a doped silicon layer 52 formed thereon. As used herein, "substrate" includes any semiconductor substrate including, but not limited to, a semiconductor wafer substrate such as silicon or GaAs. It will be understood that a "substrate" may include, among other things, a semiconductor wafer or a semiconductor wafer having various process layers formed on the wafer. As used herein, "layer" may be used interchangeably with "film". The access transistor includes one or more source-drain regions 54, field oxide regions 56 and polysilicon wordline gate areas 58. An insulating layer 60 is formed on the substrate 50 and the memory cell access transistor. A contact hole is formed through insulating layer 60, for example, using photolithographic and etched steps to expose source-drain region 54. The doped silicon layer 52 is formed on the insulating layer 60.

The doped silicon layer 52 may have, for example, a thickness of about 7,000 Å to 10,000 Å, although thicknesses of less than about 7,000 Å and greater than about 10,000 Å are also possible. The silicon layer 52 may be deposited in an amorphous or polycrystalline state. However, the silicon layer 52 is advantageously deposited in an amorphous state and crystallized during later heating steps. For example, the silicon layer 52 may be a doped silicon layer formed, for example, in the presence of a silicon source gas such as silane or disilane, and a dopant source such as $AsH_3$, $AsS_3$, $PH_3$, $PF_3$, $POCl_3$, $B_2A_6$, $BF_3$, $BCl_3$, etc. depending on the dopant desired (i.e., either n-type or p-type). In one embodiment, $PH_3$ is used. The silicon source gas and the dopant gas may be injected into a reaction chamber or furnace while the substrate 50 is heated to a predetermined temperature, for example, about 450° C. to 550° C. When silane gas and phosphine are employed, the flow rate of silane is typically adjusted to be about 500 sccm to 1500 sccm and the flow rate of phosphine is adjusted to be about 200 sccm to 300 sccm.

With benefit of this disclosure, those of skill in the art will understand that the temperature and flow rate ranges given above are exemplary only, and that values outside of these ranges may be employed which are suitable for forming doped polysilicon and/or amorphous silicon layers.

Figure 10:
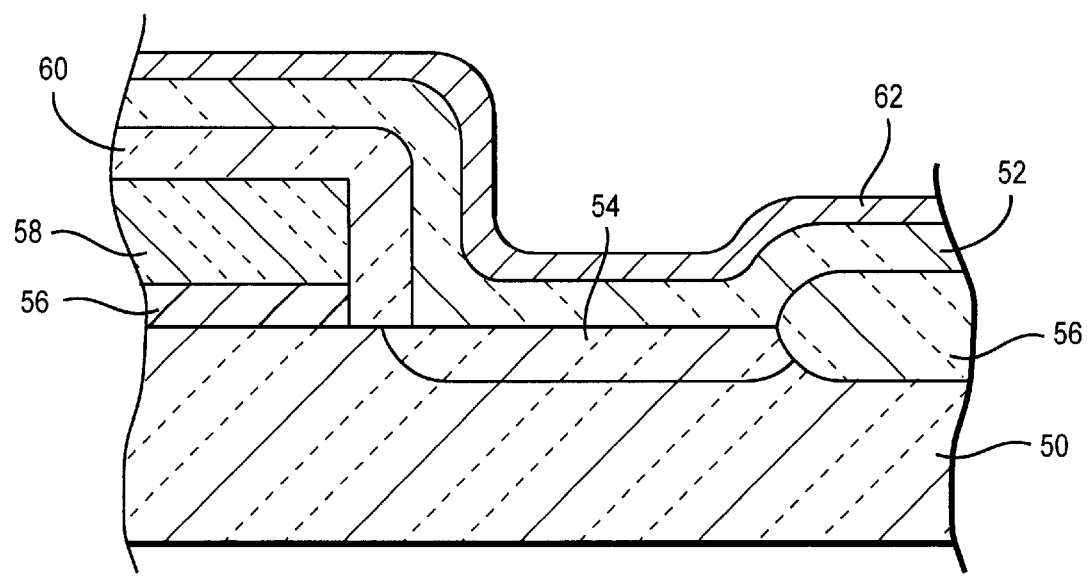
FIG. 10 is a simplified partial cross-sectional view of a semiconductor substrate showing a partially completed memory cell formed in accordance with the present invention.

Referring now to FIG. 10, a separate layer 62 may be formed following deposition of the doped first silicon layer 52 to absorb or act as a barrier to dopant out-diffusion from the doped silicon layer 52 during subsequent higher temperature process steps. As used herein, the term "barrier layer" means a layer or layers of any material suitable for reducing or substantially eliminating diffusion of dopant across the barrier layer, by blocking the movement of dopant atoms and/or by absorbing dopant atoms. The layer 62 may be any layer suitable for acting as a barrier to dopant out-diffusion from silicon, such as, for example, undoped amorphous silicon, undoped polycrystalline silicon, silicon oxide, or the like. Note that HSG silicon will grow more readily on amorphous state silicon than on polycrystalline silicon. Accordingly, if the benefits of HSG silicon are desired, the barrier layer 62 is advantageously deposited as amorphous silicon. In the embodiment illustrated in FIG. 10, an undoped amorphous silicon barrier layer 62 is formed on the doped silicon layer 52 in a manner previously described for the doped silicon layer 52, with the exception that the dopant gas source is shut off to terminate deposition of the doped first silicon layer 52, and the silicon gas source is continued so as to deposit the undoped silicon barrier layer 62. The undoped silicon barrier layer 62 may have a thickness of about 50 Å to about 200 Å, although thicknesses less than about 50 Å and greater than about 200 Å are also possible.

Figure 11:
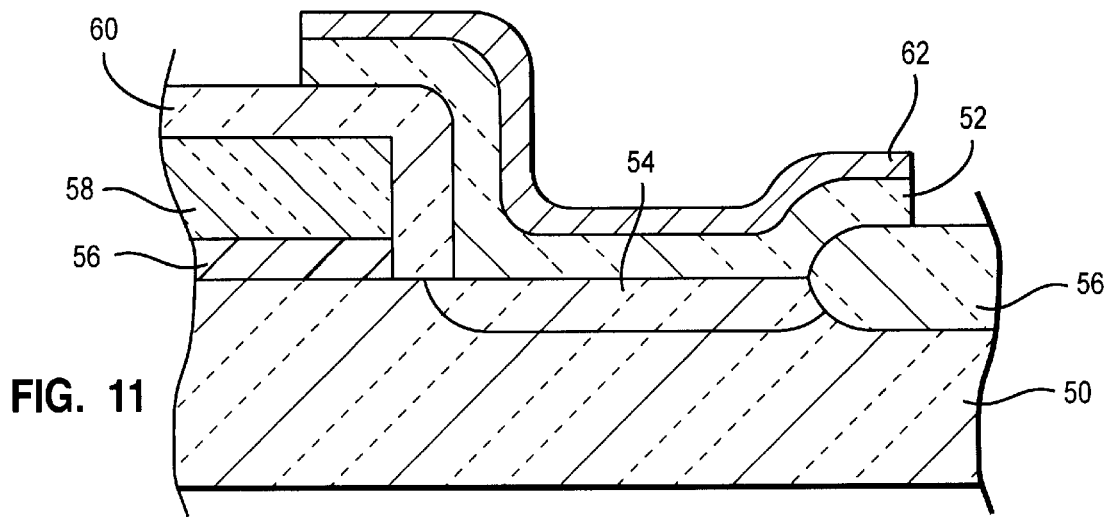
FIG. 11 is a simplified partial cross-sectional view of a semiconductor substrate showing a partially completed memory cell formed in accordance with the present invention.

As shown in FIG. 11, following formation of the barrier layer 62, standard photoresist processing may be employed to create a desired storage node pattern for the layers 52 and 62. Etch definition of the node pattern may be by well-known anisotropic etching techniques, such as, for example, reactive ion etching, chemical plasma etching or the like, using well-known chemistries suitable for etching silicon, such as, for example, $CF_4$.

Figure 12:
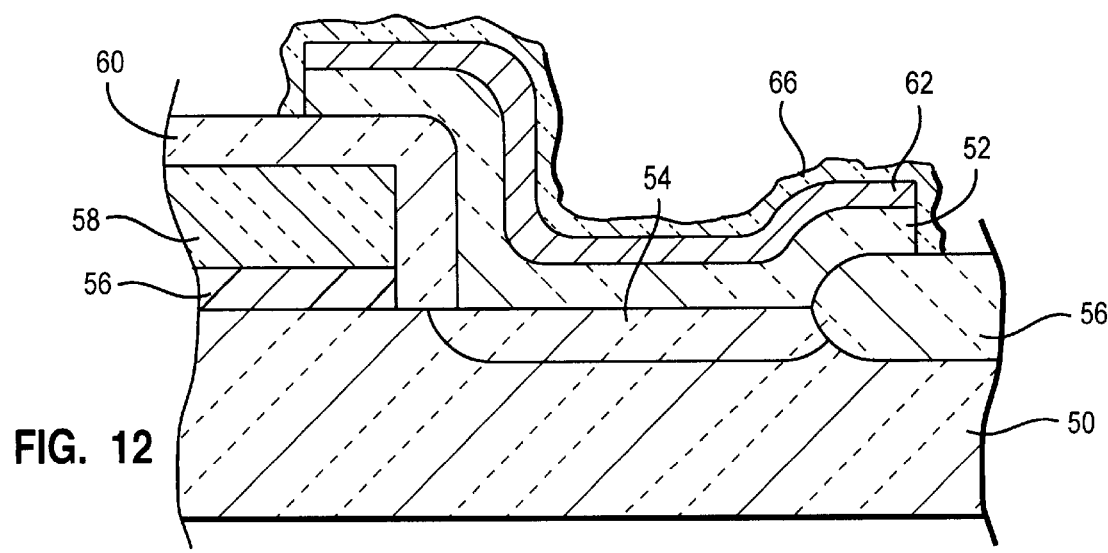
FIG. 12 is a simplified partial cross-sectional view of a semiconductor substrate showing a partially completed memory cell formed in accordance with the present invention.

Referring now to FIG. 12, the etch mask (not shown) is removed from the barrier layer 62 and a cleaning step is performed. If the benefits of HSG silicon are desired, an HSG silicon surface 66 is formed on the undoped barrier layer 62. It will be understood with benefit of this disclosure that HSG surface 66 may be formed using any method known in the art suitable for forming HSG on a silicon layer including by annealing, nucleation, molecular beam epitaxy, chemical beam epitaxy or the like. In the exemplary embodiment illustrated, the HSG polysilicon surface 66 is formed by surface seeding followed by vacuum annealing without exposure to a silicon source gas.

Figure 13:
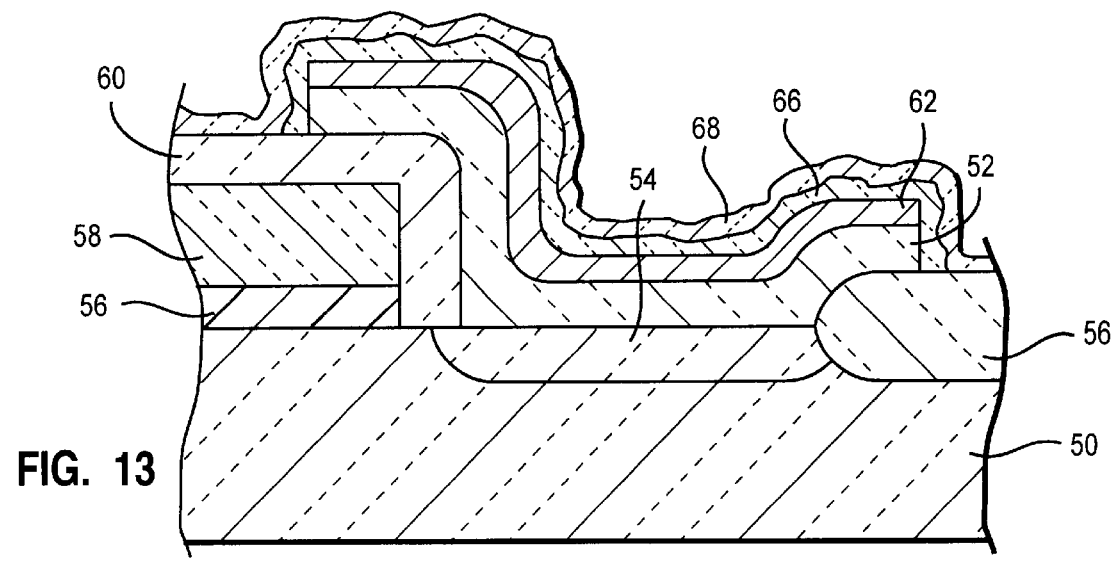
FIG. 13 is a simplified partial cross-sectional view of a semiconductor substrate showing a partially completed memory cell formed in accordance with the present invention.

Referring now to FIG. 13, a capacitor dielectric layer 68 may be formed. The capacitor dielectric may take on a variety of configurations, such as, for example, as oxide, nitride, NO or ONO dielectric layers. In an exemplary embodiment, the capacitor dielectric layer 68 may be a nitride/oxide laminate consisting of a silicon nitride layer deposited to a thickness of from about 40 Å to 60 Å, for example, using LPCVD at a temperature at about 680° C. to 780° C., capped by a a CVD oxide layer of about the same thickness.

Following deposition of the dielectric layer 68, photoresist and patterning may be employed with deposition of a second polysilicon electrode and an insulating oxide layer to finish off the memory cells. It will be understood with benefit of this disclosure that these remaining steps may be performed using any method known in the art that is suitable for forming the remaining layers of a memory cell, such as a DRAM memory cell.

Figure 14:
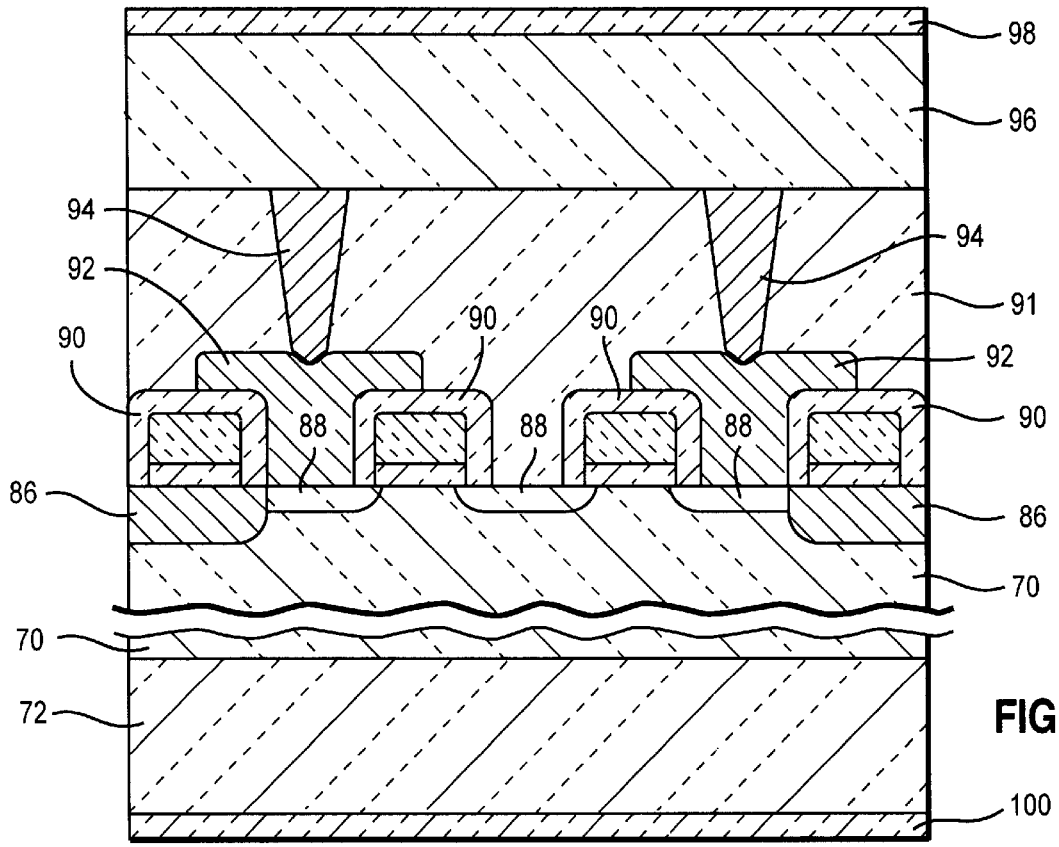
FIG. 14 is a simplified partial cross-sectional view of a semiconductor substrate showing a partially completed memory cell formed in accordance with the present invention.

FIGS. 14—17 illustrate an exemplary method in accordance with the present invention of forming stacked memory devices on a semiconductor substrate 70. Turning initially to FIG. 14, the substrate 70 has a phosphorus doped backside silicon layer 72. Field oxide regions 86, source/drain regions 88, and wordline gate areas 90 are formed on the semiconductor substrate 70 using methods known in the art including, for example, those described elsewhere herein. An insulating layer 91 is shown formed on the substrate 70, and may be, for example, silicon oxide or BPSG, tetra-ethyl-ortho-silicate ("TEOS") or the like. Source/drain contacts 92 are formed beneath the insulating layer 91, for example, by deposition of doped polysilicon or a refractory metal, such as tungsten, and subsequent photolithographic and etch steps. Additional contacts 94 are provided in the insulating layer 91 for accessing later-formed storage electrodes. The plugs 94 may be formed, for example, by etching vias in the insulating layer 91 and subsequent deposition planarization of doped polysilicon or conductive refractory metal, such as tungsten.

The doped silicon layers 72 and 96 may have, for example, a thickness of about 7,000 Å to 10,000 Å, although thicknesses of less than about 7,000 Å and greater than about 10,000 Å are also possible. The silicon layers 72 and 96 may be deposited in an amorphous state or a polycrystalline state. However, the silicon layers 72 and 96 are advantageously deposited in an amorphous state and crystallized during later heating steps. For example, the silicon layers 72 and 96 may be a doped silicon layer formed, for example, in the presence of a silicon source gas such as silane or disilane, and a dopant source such as $AsH_3$, $AsS_3$, $PH_3$, $PF_3$, $POCl_3$, $B_2A$, $BF_3$, $BCl_3$, etc. depending on the dopant desired (i.e., either n-type or p-type). In one embodiment, $PH_3$ is used. The silicon source gas and the dopant gas may be injected into a reaction chamber or furnace while the substrate 70 is heated to a predetermined temperature, for example, about 450° C. to 550° C. When silane gas and phosphine are employed, the flow rate of silane is typically adjusted to be about 500 sccm to 1500 sccm and the flow rate of phosphine is adjusted to be about 200 sccm to 300 sccm.

Still referring to FIG. 14, undoped silicon barrier layers 98 and 100 are shown formed on phosphorus doped polysilicon layers 72 and 96, respectively. In this regard, undoped silicon layers 98 and 100 may be formed in a manner as described elsewhere herein, such as in a LPCVD process in which phosphorus dopant gas is discontinued, but silicon dopant gas is continued, after deposition of phosphorus doped silicon layers 72 and 96. In an exemplary embodiment, the thickness of the undoped polysilicon layers 98 and 100 may be about 50 Å to 200 Å. However, the preceding thickness ranges given for the layers 72, 96, 98 and 100 are exemplary only, and it will be understood with benefit of this disclosure that thickness values outside each of these ranges (i.e., both greater and lesser values) are also possible. The layers 98 and 100 may be deposited as amorphous or polycrystalline silicon. Note that HSG silicon will grow more readily on amorphous state silicon than on polycrystalline silicon. Accordingly, if the benefits of HSG silicon are desired, the barrier layers 98 and 100 are advantageously deposited as amorphous silicon. Subsequent heating will produce crystallization.

Although the barrier layers 98 and 100 are shown and described as undoped silicon layers, it will be understood with benefit of this disclosure that any layer suitable for acting as a barrier to dopant out-diffusion from the silicon layers 72 and 96 may be alternately employed including, but not limited to, undoped amorphous silicon, oxides of silicon or the like.

Figure 15:
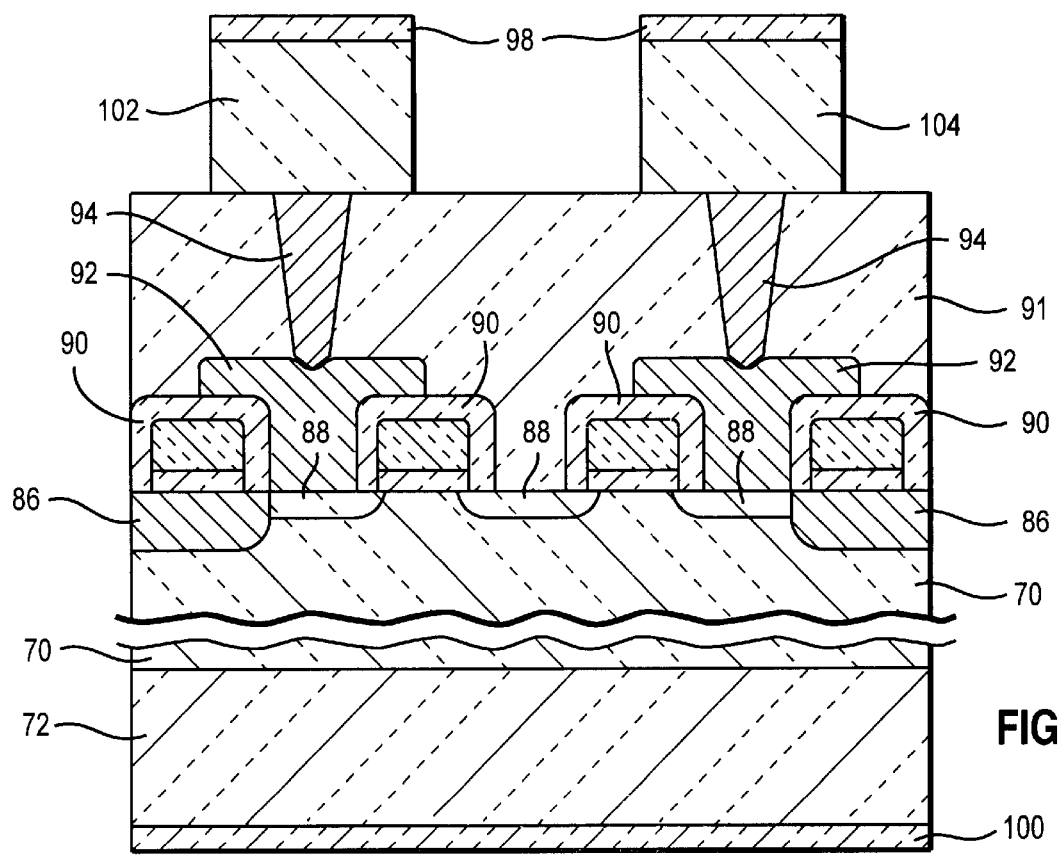
FIG. 15 is a simplified partial cross-sectional view of a semiconductor substrate showing a partially completed memory cell formed in accordance with the present invention.

Referring now to FIG. 15, storage electrodes 102 and 104 are formed by masking and etching the barrier layer 98 and the underlying doped polysilicon layer 96. The etching is advantageously anisotropic and may be performed using reactive ion etching, chemical plasma etching or the like using well know etch chemistries suitable to directionally etch silicon, such as, for example, $CF_4$.

Figure 16:
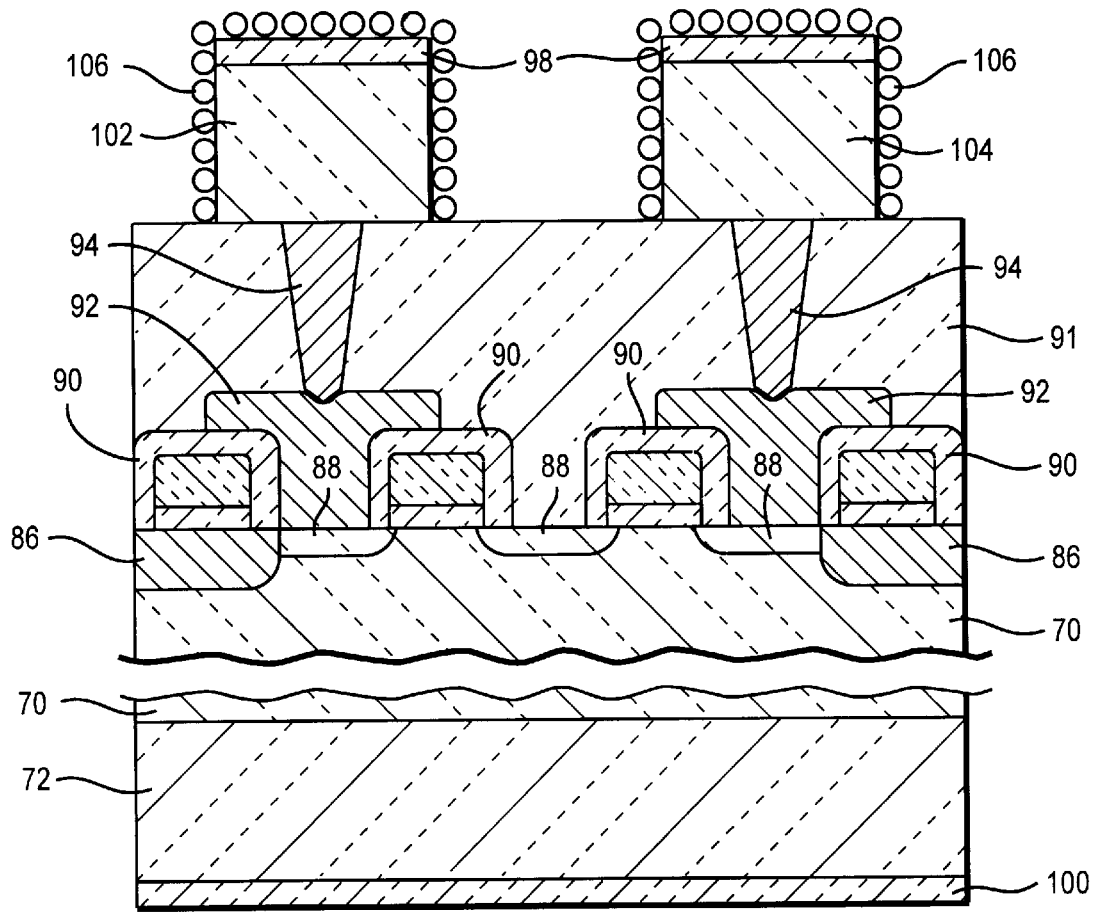
FIG. 16 is a simplified partial cross-sectional view of a semiconductor substrate showing a partially completed memory cell formed in accordance with the present invention.
Figure 17:
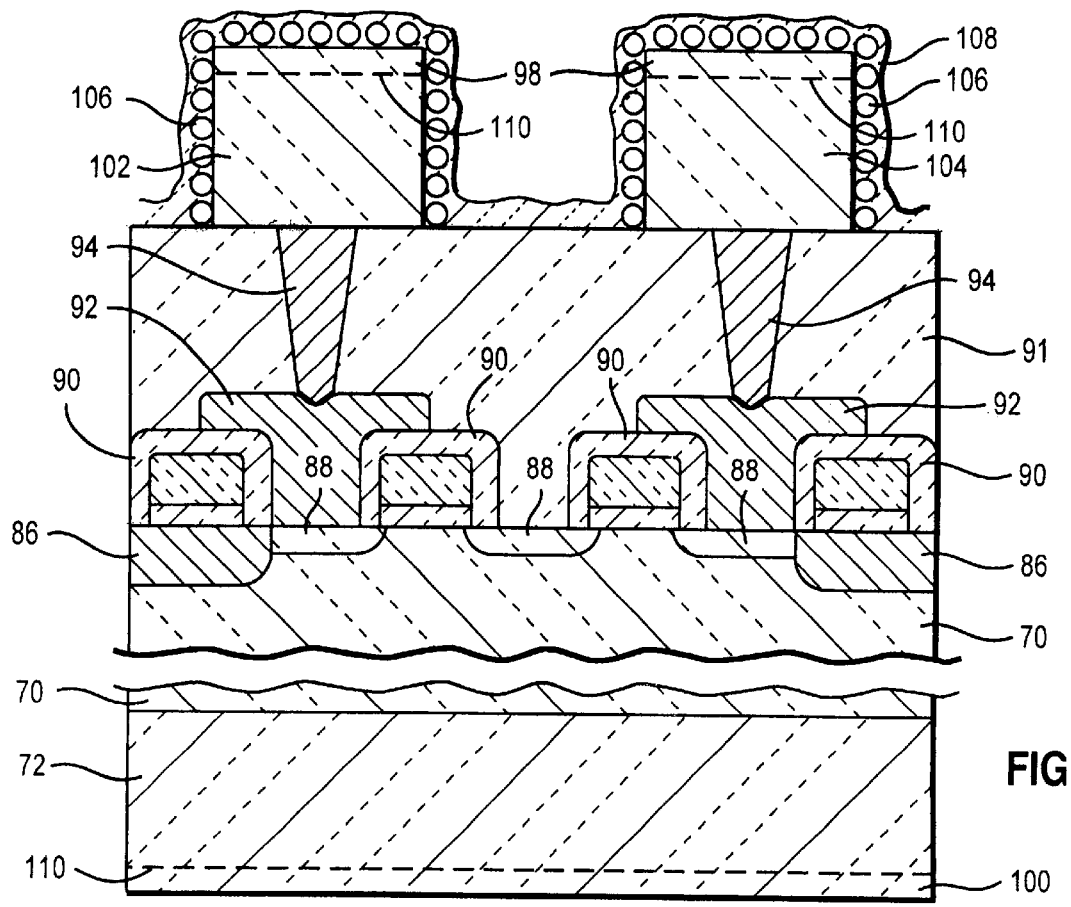
FIG. 17 is a simplified partial cross-sectional view of a semiconductor substrate showing a partially completed memory cell formed in accordance with the present invention.

Referring now to FIG. 16, an HSG silicon surface 106 is formed on the storage electrodes 102 and 104 using, for example, methods as described elsewhere herein. Referring now also to FIG. 17, a capacitor dielectric layer 108 is formed on the HSG silicon surface 106. Various dielectric materials may be used, such as, for example, oxide, nitride, NO or ONO dielectric layers. In an exemplary embodiment, the capacitor dielectric layer 68 may be a nitride/oxide laminate consisting of a silicon nitride layer deposited to a thickness of from about 40 Å to 60 Å, for example, using LPCVD at a temperature at about 680° C. to 780° C., capped by a CVD oxide layer of about the same thickness. As shown in FIG. 17, during subsequent thermal cycles, phosphorus diffuses gradually out of the doped silicon layer 72 and the doped silicon storage electrodes 102 and 104 to dope the previously undoped polysilicon layers 98 and 100 (the previous boundaries of which are indicated by dashed lines 110 in FIG. 17) and the HSG silicon layer 106. This heating results in crystallization of most, if not all, of the electrodes 102 and 104 and the barrier layers 98 and 100.

The presence of the barrier layers 98 produces a larger average grain size of HSG silicon grains formed on the upper or top side of the storage electrodes 102 and 104, including the layers 98, than the average size of HSG grains formed on the doped polysilicon top surface of storage electrodes 52 formed in conventional processes, such as illustrated in FIGS. 5 and 6. This larger HSG grain size results in increased surface area and capacitance of DRAM cells formed using embodiments of the disclosed method, over DRAM cells formed using conventional methods. Furthermore, the thickness of the dielectric layer 108 is relatively insensitive to furnace load size, and is typically increased over the thickness of a similar layer (e.g., the layer 66 of FIG. 6) formed in a conventional process with the same furnace load.

Figure 18:
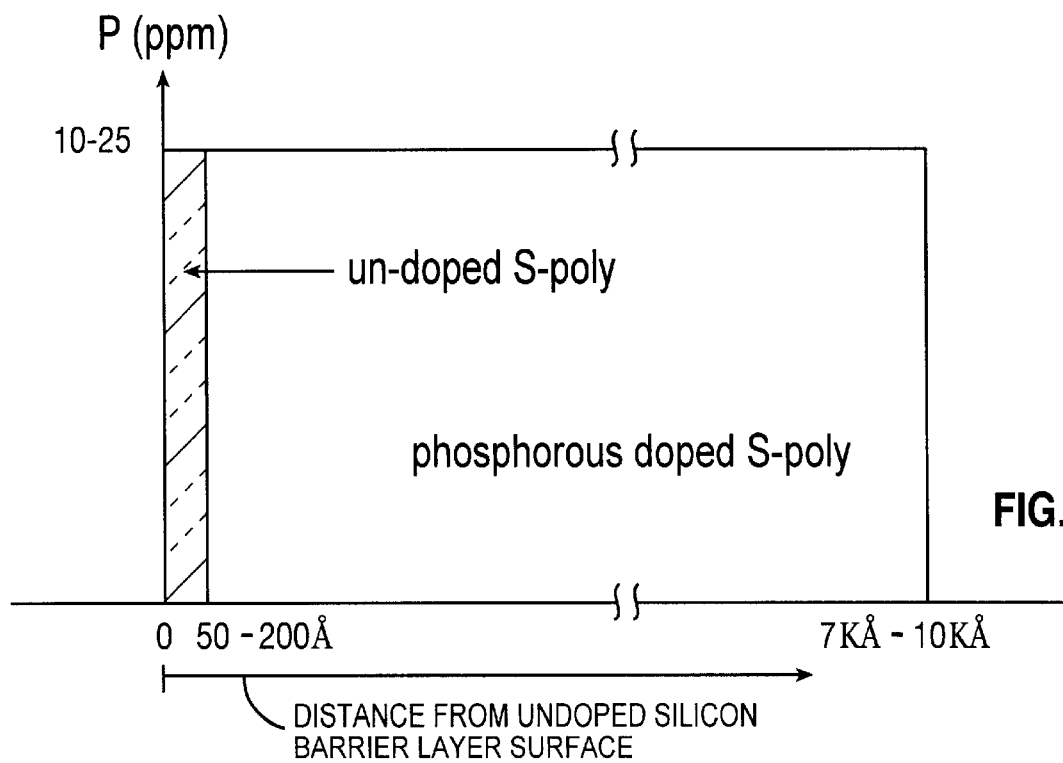
FIG. 18 shows phosphorus dopant concentration profile for a phosphorus doped polysilicon electrode formed in accordance with the present invention.

FIG. 18 shows phosphorus concentration as a function of distance from the surface of the undoped polysilicon barrier layer 98 immediately after deposition thereof for one embodiment of the disclosed method in which the doped polysilicon layer 96 has a thickness of about 7,000 Å to 10,000 Å, and the undoped silicon barrier layer 98 is formed thereon with a thickness of about 50 Å to 200 Å. As may be seen in FIG. 18, phosphorus concentration is substantially constant throughout the doped silicon layer 96 at about 15 ppm and little or substantially no phosphorus is present in undoped polysilicon layer 98. A similar profile should occur in the doped polysilicon layer 72 on the backside of the substrate 70.

Figure 19:
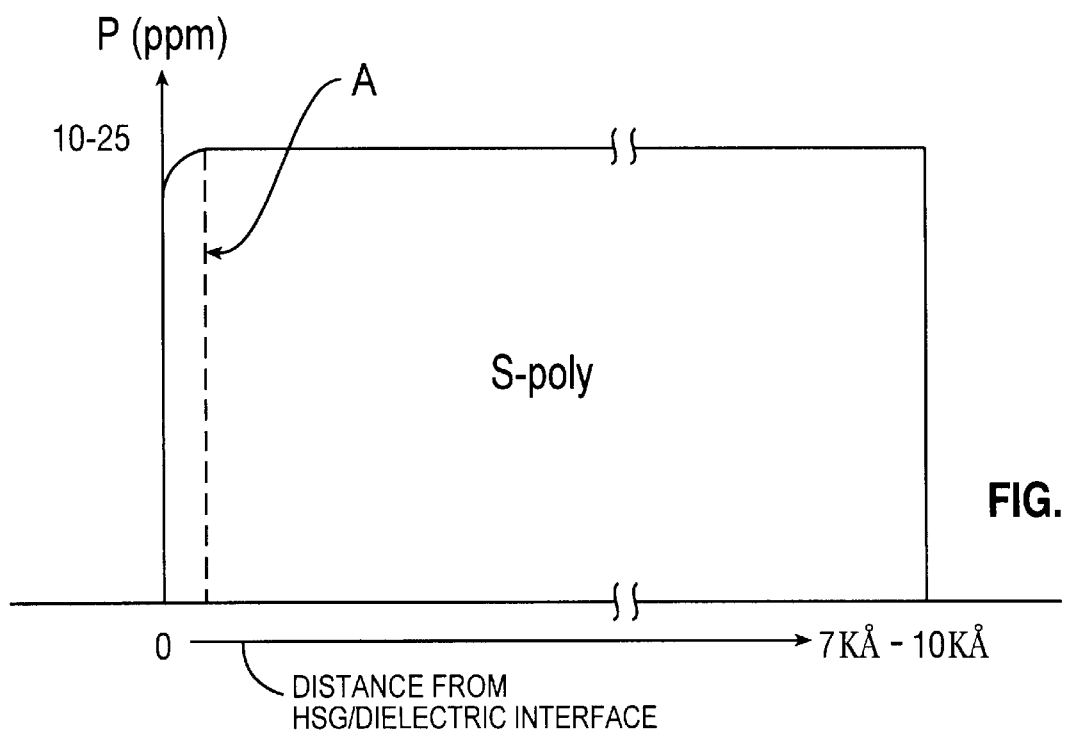
FIG. 19 shows phosphorus dopant concentration profile for a phosphorus doped polysilicon electrode formed in accordance with the present invention.

FIG. 19 shows phosphorus dopant concentration for the storage electrodes 102 and 104 of FIG. 17 following the HSG anneal and capacitor dielectric steps described above. As illustrated in FIG. 19, the concentration of phosphorus doping is at a constant level of about 15 ppm up to the pre-existing delineation point between the doped polysilicon electrodes 102 and 104 and the overlying undoped polysilicon layer 98. This delineation point is denoted in FIG. 19 by the dashed line labeled A. From delineation point A to the interface between the outer surface of the HSG silicon layer 106 and the capacitor dielectric layer 108, the phosphorus concentration drops to about 10 ppm. A similar profile should occur in the doped polysilicon layer 72 and the undoped polysilicon layer 100 on the backside of the substrate 70.

At process completion, the phosphorus doping concentrations are essentially the same for storage electrodes 102 and 104 of FIG. 17 formed by the disclosed method, and the conventionally-formed storage electrodes 44 of FIG. 6. This may be seen by comparing the dopant concentration profiles of FIG. 8 and FIG. 19. However, as previously mentioned, the disclosed method results in enhanced HSG silicon growth and storage cell capacitance, as well as improved dielectric thickness characteristics.

Silicon oxides are one example of an alternate type of barrier layer which may be employed to eliminate or substantially reduce dopant out-diffusion from a doped silicon layer during high temperature process steps. In this regard, oxide barrier layers may deposited, for example, in place of the undoped silicon barrier layers 98 and/or 100 of FIG. 14. Such oxide barrier layers may be formed on the doped silicon layers 72 and/or 96 to a desired thickness using any suitable method known in the art. For example, a barrier silicon dioxide layer may be thermally grown, or deposited by CVD. The desired thickness of a barrier oxide layer is typically selected so that the layer functions as a barrier to phosphorus out-diffusion from underlying doped silicon layers 72 and 96 during subsequent processing steps. In one embodiment, such an oxide layer may have a thickness of from about 5 Å to about 15 Å, although thicknesses outside this range (greater or lesser) are also possible.

Figure 20:
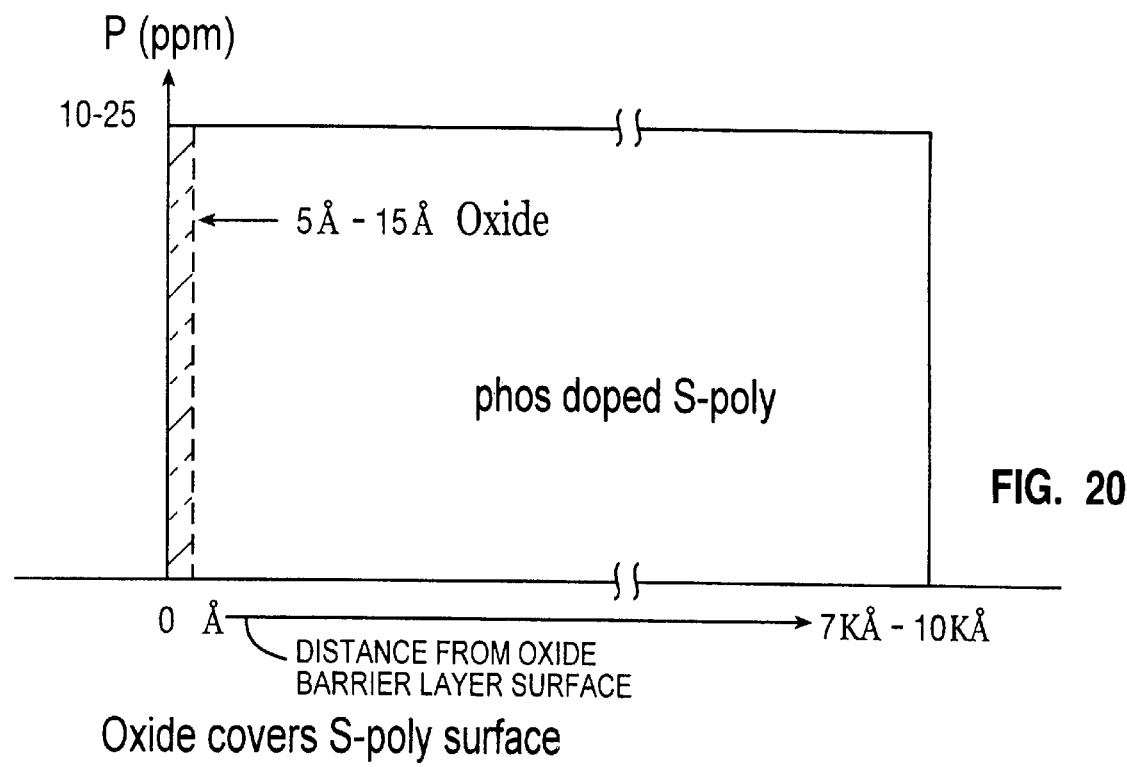
FIG. 20 shows phosphorus dopant concentration profile for a phosphorus doped polysilicon electrode formed in accordance With the present invention.

FIG. 20 shows phosphorus dopant concentration for a doped polysilicon storage electrode like the storage electrode 102 shown in FIG. 16, but with a thin oxide barrier layer present on the surface of the electrode. As may be seen, the concentration of phosphorus doping is at a constant level of about 15 ppm throughout the electrode up to the interface between the oxide layer and the doped silicon of the electrode. A similar profile should be expected to occur in the doped silicon layer when an oxide layer is deposited on the backside of the substrate 70, in place of the undoped silicon barrier layer 100 of FIGS. 14–16. When oxide barrier layers are employed, the oxide may be left in place on the doped silicon layer during process steps such as photolithography and etch definition of the desired node patterns. Thereafter, the oxide barrier film may be etched from the surface of the storage electrode prior to HSG growth, for example, by using an HF etch. An oxide barrier layer on the backside of a wafer may remain through deposition of capacitor dielectric. In this way, dopant out-diffusion from both front side doped storage electrode and backside doped polysilicon layers may be substantially prevented or reduced through process steps up to HSG growth. Outdiffusion from backside polysilicon layer may be prevented or substantially reduced during HSG anneal and dielectric deposition. Final dopant profiles achieved should be similar to that shown in FIG. 19.

Using methods disclosed herein, improved uniformity, process robustness and thickness of dielectric layers (such as oxide, nitride, NO or ONO dielectric layers), as well as improved HSG density and grain size may be achieved, for example, during DRAM fabrication. In embodiments of the methods disclosed herein, dopant concentration (such as phosphorus concentration) in silicon layers may be controlled by deposition of barrier layers. Using the disclosed method, phosphorus out-diffusion during elevated temperatures may be substantially eliminated or reduced during relatively high temperature processing, such as HSG anneal and dielectric deposition, without reducing the number of wafers processed in a batch. Thus, reactor throughput may advantageously be maintained at the same time DRAM performance is enhanced.

Surprisingly, using the disclosed methods, HSG grain size, density and uniformity, as well as DRAM memory cell capacitance, may be enhanced due to the ease of amorphous silicon autodiffusion. In one fabrication embodiment,sa thin, undoped polysilicon barrier layer may be deposited on a phosphorus doped polysilicon present on the front and/or backside of a semiconductor wafer layer, prior to subsequent deposition of amorphous silicon or polysilicon HSG seed layers. To obtain such a profile with doped and undoped silicon layers, phosphine gas flow may be shut off prior to termination of silane or disilane silicon source gas that is used to produce a first doped silicon storage electrode layer. Subsequently, phosphorus out-diffuses gradually into the undoped silicon barrier layer during higher temperature processing (e.g., nitride deposition, BPSG flow, etc.), with minimum phosphorus autodoping at the HSG interface with the capacitor dielectric layer (e.g., oxide, nitride, NO, ONO, etc.). Diffusion of phosphorus dopant toward the surface occurs by virtue of temperature and concentration gradients. This diffusion is advantageous because phosphorus increases memory cell capacitance. Advantageously, the thickness of an undoped polysilicon barrier layer may be controlled to result in diffusion of dopant to the surface at the end of HSG anneal and/or capacitor dielectric layer deposition process. Thus, a capacitor electrode layer having higher quality HSG and reduced dielectric layer thickness variation may be achieved without reduction in the number of wafers employed per furnace batch.

Although particular exemplary embodiments have been described and illustrated herein, it will be understood with benefit of this disclosure that barrier layers of the disclosed method may be advantageously employed in the fabrication of, any DRAM memory cell type where dopant out-diffusion may adversely affect memory cell capacitance, including stacked, trench and conventional memory cell structures. Furthermore, although embodiments illustrated herein show barrier layers employed on the front side and backside of a semiconductor substrate, it will be understood that a barrier layer may be employed on only one of the substrate surfaces. In addition, combinations of barrier layer types may be employed together, either in layered fashion or separately. For example, an oxide layer may be employed on the backside of a substrate, while an undoped silicon layer may be simultaneously employed on the frontside of the same substrate. Alternatively, an undoped layer may be employed on either a front or backside of a substrate, with a layer of oxide deposited thereon.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming hemispherical grain silicon on a substrate having a front side and a backside, comprising:
   forming a first doped silicon layer on the front side of the substrate;
   forming a first undoped amorphous silicon barrier layer on the first doped silicon layer;
   forming a hemispherical grain silicon layer on the undoped amorphous silicon barrier layer;
   depositing a second doped layer silicon layer on the backside of the substrate by exposing the substrate to a silicon source gas and a dopant gas; and
   forming a barrier layer on the second doped silicon layer to inhibit dopant out-diffusion from the second doped silicon layer.

2. The method of claim 1, wherein the first doped silicon layer comprises phosphorus doped amorphous silicon.

3. The method of claim 1, wherein the first doped silicon layer comprises phosphorus doped polysilicon.

4. The method of claim 1, wherein the substrate is heated to convert the first undoped amorphous silicon barrier layer to doped polysilicon.

5. The method of claim 1, wherein the barrier layer comprises undoped amorphous silicon.

6. The method of claim 1, wherein the barrier layer comprises undoped amorphous silicon, undoped polysilicon or oxide.

7. The method of claim 1, wherein the first doped silicon layer is formed by exposing the substrate to a treatment gas comprising a silicon source gas and a dopant gas, the first undoped amorphous silicon barrier layer being formed by exposing the first doped silicon layer to a treatment gas comprising a silicon source gas and substantially no dopant gas.

8. The method of claim 7, wherein the silicon source gas comprises silane, disilane or a mixture thereof, and the dopant gas comprises at least one of phosphine, arsine, diborane, or a mixture thereof.

9. A method of forming a memory cell storage electrode on a substrate having a front side and a backside, comprising:
   forming a first doped silicon layer on the front side of the substrate;
   forming a first undoped amorphous silicon barrier layer on the first doped silicon layer;
   forming a hemispherical grain silicon layer on the undoped amorphous silicon barrier layer;
   forming a capacitor dielectric layer on the hemispherical grain silicon layer;
   depositing a second doped layer silicon layer on the backside of the substrate by exposing the substrate to a silicon source gas and a dopant gas; and
   forming a barrier layer on the second doped silicon layer to inhibit dopant out-diffusion from the second doped silicon layer.

10. The method of claim 9, wherein the capacitor dielectric layer comprises a nitride/oxide laminate.

11. The method of claim 9, wherein the first doped silicon layer is formed by exposing the substrate to a treatment gas comprising a silicon source gas and a dopant gas, the first undoped amorphous silicon barrier layer being formed by exposing the first doped silicon layer to a treatment gas comprising a silicon source gas and substantially no dopant gas.

12. The method of claim 11, wherein the silicon source gas comprises silane, disilane or a mixture thereof, and the dopant gas comprises at least one of phosphine, arsine, diborane, or a mixture thereof.

13. The method of claim 9, wherein the first doped silicon layer comprises phosphorus doped amorphous silicon.

14. The method of claim 9, wherein the first doped silicon layer comprises phosphorus doped polysilicon.

15. The method of claim 9, wherein the substrate is heated to convert the first undoped amorphous silicon barrier layer to doped polysilicon.

16. The method of claim 9, wherein the barrier layer comprises undoped amorphous silicon.

17. The method of claim 9, wherein the barrier layer comprises undoped amorphous silicon, undoped polysilicon or oxide.

18. A method of forming hemispherical grain silicon on a substrate having a front side and a backside, comprising:
   forming a first doped silicon layer on the front side and depositing a second doped silicon layer on the backside by exposing the substrate to a silicon source gas and a dopant gas;
   forming a first oxide barrier layer on the first doped silicon layer and a second barrier layer on the second doped silicon layer, the second barrier layer inhibiting dopant out-diffusion from the second doped silicon layer; and
   removing the first oxide barrier layer and thereafter forming a hemispherical grain silicon layer on the first doped silicon layer.

19. The method of claim 18, wherein the second barrier layer comprises oxide.

20. The method of claim 18, wherein the second buffer layer comprises undoped amorphous silicon.

21. The method of claim 18, wherein the second barrier layer comprises undoped amorphous silicon, undoped polysilicon or oxide.

22. The method of claim 18, wherein the first doped silicon layer and the second doped silicon layer comprise phosphorus doped amorphous silicon.

23. The method of claim 18, wherein the first doped silicon layer and the second doped silicon layer comprise phosphorus doped polysilicon.

24. The method of claim 23, wherein the substrate is healed to convert tie first and second doped silicon layers to doped polysilicon.

25. The method of claim 18, wherein the forming of the second barrier layer comprises exposing the second doped silicon layer to a treatment gas comprising a silicon source gas and substantially no dopant gas.

26. The method of claim 25, wherein the silicon source gas comprises silane, disilane or a mixture thereof, and the dopant gas comprises at least one of phosphine, arsine, diborane, or a mixture thereof.

27. A method of forming a memory cell capacitor on a substrate having a front side and backside, comprising:
   forming a first doped silicon layer on the front side of the substrate;
   forming a first undoped amorphous silicon barrier layer on the first doped silicon layer;
   forming a hemispherical grain silicon layer on the first barrier layer;
   forming a capacitor dielectric layer on the hemispherical grain silicon layer;
   forming a top electrode on the capacitor dielectric;
   depositing a second doped layer silicon layer on the backside of the substrate by exposing the substrate to a silicon source gas and a dopant gas; and
   forming a barrier layer on the second doped silicon layer to inhibit dopant out-diffusion from the second doped silicon layer.

28. The method of claim 27, wherein the first doped silicon layer is formed by exposing the substrate to a treatment gas comprising a silicon source gas and a dopant gas, the first undoped amorphous silicon barrier layer being formed by exposing the first doped silicon layer to a treatment gas comprising a silicon source gas and substantially no dopant gas.

29. The method of claim 27, wherein the first doped silicon layer is formed by exposing the substrate to a treatment gas comprising a silicon source gas and a dopant gas, the first undoped amorphous silicon barrier layer being formed by exposing the first doped silicon layer to a treatment gas comprising silicon source gas and substantially no dopant gas.

30. The method of claim 29, wherein the silicon source gas comprises silane, disilane or a mixture thereof, and the dopant gas comprises at least one of phosphine, arsine, diborane, or a mixture thereof.

31. The method of claim 27, wherein the first doped silicon layer comprises phosphorus doped amorphous silicon.

32. The method of claim 27, wherein the first doped silicon layer comprises phosphorus doped polysilicon.

33. The method of claim 27, wherein the barrier layer comprises undoped amorphous silicon.

34. The method of claim 27, wherein the barrier layer comprises undoped amorphous silicon, undoped polysilicon or oxide.

35. The method of claim 27, wherein the substrate is heated to convert the first undoped amorphous silicon barrier layer to doped polysilicon.

36. A method of forming hemispherical grain silicon on a substrate having a front side and a backside, comprising:
   forming a first doped silicon layer on the front side of the substrate;
   forming a first oxide barrier layer on the first doped silicon layer;
   patterning the first oxide barrier layer and the first doped silicon layer into a desired shape;
   depositing a second doped layer silicon layer on the backside of the substrate by exposing the substrate to a silicon source gas and a dopant gas;
   forming a barrier layer on the second doped silicon layer, the barrier layer inhibiting dopant out-diffusion from the second doped silicon layer;
   removing the first oxide barrier layer; and
   forming a hemispherical grain silicon layer on the first doped silicon layer.

37. The method of claim 36, wherein the first doped silicon layer comprises phosphorus doped amorphous silicon.

38. The method of claim 36, wherein the first doped silicon layer comprises phosphorus doped polysilicon.

39. The method of claim 1, wherein the substrate is heated to convert the first undoped amorphous silicon barrier layer to doped polysilicon.

40. The method of claim 36, wherein the barrier layer comprises oxide.

* * * * *